United States Patent [19]

Hwang

[11] Patent Number: 5,442,337
[45] Date of Patent: Aug. 15, 1995

[54] DEVICE FOR PROTECTION OF DIGITAL MULTIMETER FROM MISINSERTION OF INPUT PLUG

[75] Inventor: Dong W. Hwang, Kumi, Rep. of Korea

[73] Assignee: H.U. Kim & Associates, Seoul, Rep. of Korea

[21] Appl. No.: 209,776

[22] Filed: Mar. 10, 1994

[30] Foreign Application Priority Data

Apr. 20, 1993 [KR] Rep. of Korea .............. 93-6463

[51] Int. Cl.⁶ ............................................. G08B 21/00
[52] U.S. Cl. ................................. 340/635; 340/686; 340/687; 324/110; 324/115
[58] Field of Search ............... 340/635, 686, 687, 693; 324/110, 115

[56] References Cited

U.S. PATENT DOCUMENTS 5,166,599  11/1992  Hochreuther et al. .............. 324/115
5,243,275  9/1993  Nakazawa et al. ................ 324/110

Primary Examiner—Jeffery A. Hofsass
Assistant Examiner—Julie Lieu
Attorney, Agent, or Firm—Hickman & Beyer

[57] ABSTRACT

A device for protection of a digital multimeter from misinsertion of an input plug. The device prevents misinsertion of the input plug into an input core having no concern with a selected function and generates an alarm sound when a function switch is unconsciously rotated disregarding insertion of the input plug in an input core. The device comprises a plug misinsertion preventing unit for preventing the input plug from being inserted into specified one of the plug inserts when a function except a specified function is selected, the specified function corresponding to the specified plug insert. An alarm generating unit for alarming when the function switch is operated in order to change a function under the condition that the input plug is continuously inserted in the specified plug insert. The plug misinsertion preventing unit comprises a rotating plate and a shielding layer cooperating with the rotating plate. The shielding layer selectively shields the specified plug insert. The alarm generating unit comprises an alarm generating circuit having switching parts comprising contact springs.

13 Claims, 6 Drawing Sheets

FIG. 4A  FIG. 4B  FIG. 4C
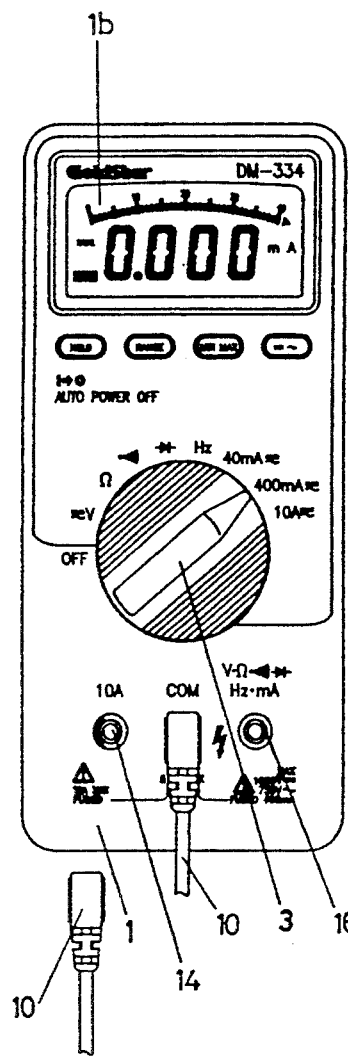
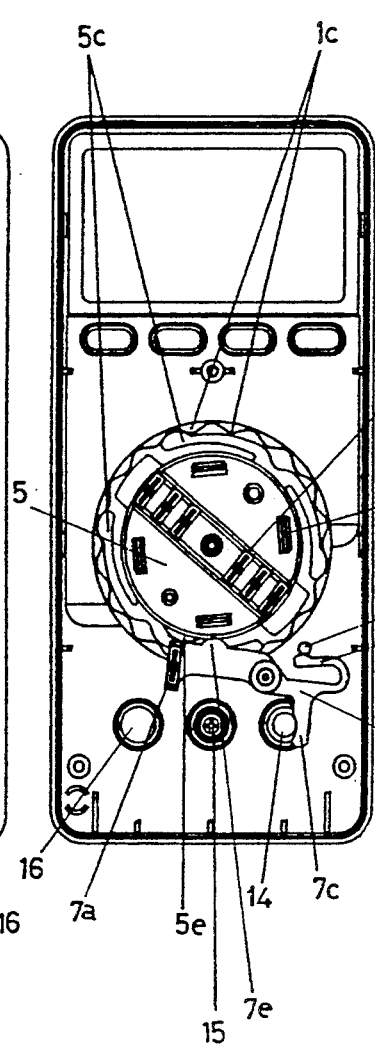
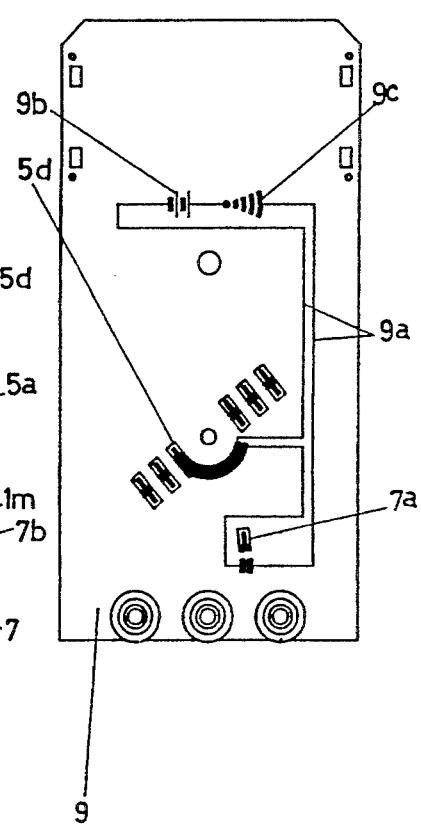

DEVICE FOR PROTECTION OF DIGITAL MULTIMETER FROM MISINSERTION OF INPUT PLUG

BACKGROUND OF THE INVENTION

1. Field of the Invention

The present invention relates in general to a protection device for a digital multimeter and, more particularly, to a device for prevention of the power supply for a plug insert corresponding to a specified measuring function of the digital multimeter when the specified function is not selected.

2. Description of the Prior Art

As well known to those skilled in the art, digital multimeters are used for measuring resistance, current etc. When a rotary type function switch of a digital multimeter is rotated to select, for example, a function except the 10 ampere (A) function, an input terminal of 10A or a 10A plug insert of the multimeter should be prevented from being applied with voltage. Otherwise, the digital multimeter may be electrically shocked and damaged. In order to achieve the above object, there have been proposed several types of devices for protection of digital multimeters, such as a device for signaling a plug misinsertion and a device for exclusively opening a plug insert corresponding to a selected function.

With reference to FIG. 1A, there is shown a conventional device for signaling the plug misinsertion. This device signals the misinsertion of the input plug of the digital multimeter when the input plug is unconsciously inserted into the 10A plug insert of the multimeter while disregarding the selection of a function except the 10A function. The above signaling device comprises a signaling circuit 110 which is formed on a printed circuit board (PCB) and in which alarm means 111 and a power source 112 are electrically connected to each other. The ON/OFF operation of the signaling circuit 110 is carried out by both a contact spring 105a mounted on a lower surface of the function switch and a plug insert or an input core 117. This input core 117 includes two terminals 117a and 117b therein and causes the circuit 110 to be closed when the input plug 115 is inserted into the input core 117 as shown in FIG. 1B. The contact spring 105a is mounted on a predetermined position of the lower surface of the function switch such that it reliably closes the alarming circuit 110 when a function except the 10A function is selected by the function switch but opens the circuit 110 when the 10A function is selected by the switch.

When the input plug 115 is inserted into the input core 117 of the device under the condition that the function except the 10A function was selected by the function switch, the signaling circuit 110 is closed and signals, using its alarm means 111, the misinsertion of the input plug 115 into the input core 117. In order to generate the alarm, the contact spring 105a of the function switch as well as the two terminals 117a and 117b of the input core 117 must be turned on at the same time in order to close the alarming circuit 110.

Turning to FIGS. 2A and 2B, there is shown a device for exclusively opening an input plug insert corresponding to a selected desired function. The device comprises a shielding plate 123 which is hinged to a lower surface of a top case 120 of the digital multimeter such that it is rotated when a rotary type function switch 122 is rotated for selection of a desired function. That is, the shielding plate 123 is rotated by rotation of the function switch 122, otherwise stated, this plate 123 cooperates with this switch 122. When the rotary function switch 122 is rotated and selects the 10A function, an input core 124 corresponding to the 10A function is exposed to the outside while another input core 126 is shielded by the shielding plate 123 as shown in FIG. 2B. On the other hand, when the rotary function switch 122 is rotated and selects a function except the 10A function, the input core 124 corresponding to the 10A function is shielded by the shielding plate 123 while the other input core 126 is exposed to the outside as shown in FIG. 2A.

However, the above devices for protection of digital multimeters have their respective problems described hereinbelow.

The plug misinsertion signaling device of FIGS. 1A and 1B, while generating an alarm sound in the case of a plug misinsertion, nevertheless has a problem in that it cannot previously prevent the plug misinsertion. In addition, when the input plug is removed from a voltage measuring input core and inserted into the 10A current measuring input core in the state that the voltage measuring function was selected by the function switch, the voltage is applied to the digital multimeter before the alarm sound is generated by the alarm means 111, thus causing electric shock and damage to the digital multimeter.

Meanwhile, the device having the rotatable shielding plate 123 of FIGS. 2A and 2B, while preventing misinsertion of the input plug, nevertheless has a problem in that it generates no alarm sound. The practical use of this device causes another problem. That is, when setting a desired function, the input plug having been inserted in an input core must be removed from that input core before rotation of the function switch and, thereafter, this input plug must be inserted into another input core corresponding to the desired function after rotation of the function switch for selection of the desired function. Thus, this device requires the user to remove the input plug from an input core and to insert the plug into another insert core on all occasions of operation of the function switch.

SUMMARY OF THE INVENTION

It is, therefore, an object of the present invention to provide a device for the protection of a digital multimeter from misinsertion of an input plug in which the aforementioned problems caused by the conventional multimeter protection devices are avoided; and to prevent misinsertion of the input plug into an input core having no relationship with a selected function; and to generate an alarm sound when a function switch is unconsciously rotated disregarding insertion of the input plug in an input core, thus protecting the digital multimeter and improving the reliability of the digital multimeter.

In order to accomplish the above object, the present invention provides a device for the protection of a digital multimeter from misinsertion of an input plug, the multimeter having a measuring result display on its top case, a plurality of plug inserts and a rotary type function switch selecting a desired function, comprising: plug misinsertion preventing means for preventing the input plug from being inserted into specified one of the plug inserts when a function except a specified function is selected, the specified function corresponding to the specified plug insert; and alarm generating means for signaling when the function switch is operated in order to change a function under the condition that the input plug is continuously inserted in the specified plug insert.

In an embodiment, the plug misinsertion preventing means comprises a rotating plate coupled to a lower surface of the function switch and rotated at the same time of rotation of the function switch, the rotating plate having a protrusion on its periphery; and a shielding lever rotatably mounted on a lower surface of the top case of the multimeter under the rotating plate such that it cooperates with the rotating plate, the shielding lever being turned at a predetermined angle by the protrusion of the rotating plate when the rotating plate is rotated, thus shielding the specified plug insert. The alarm generating means comprises a contact spring mounted on a lower surface of the rotating plate, a contact spring mounted on an end of the shielding lever, and an alarm generating circuit having both switching parts and alarm means, the switching parts comprising the contact springs, the circuit being switched on by the contact springs, thus turning on the alarm generating circuit and letting the circuit generate the alarm.

BRIEF DESCRIPTION OF THE DRAWINGS

The above and other objects, features and other advantages of the present invention will be more clearly understood from the following detailed description taken in conjunction with the accompanying drawings, in which:

FIGS. 2A and 2B are front views of a conventional digital multimeter protection device exclusively opening an input core corresponding to a selected function, respectively, in which:

FIG. 2A shows a state of the device when selecting a function except the 10 ampere function; and FIG. 2B shows a state of the device when selecting the 10 ampere function;

FIGS. 4A to 4C are views of the protection device of FIG. 3, showing an operation of the device when selecting a function except a specified function, in which:

FIG. 4A is a front view of the device;

FIG. 4B is a bottom view of the device from which a bottom case is removed; and

FIG. 4C is a front view of a printed circuit board of the device;

FIGS. 5A to 5C are views of the protection device of FIG. 3, showing an operation of the device when selecting the specified function respectively, in which:

FIG. 5A is a front view of the device;

FIG. 5B is a bottom view of the device from which a bottom case is removed; and

FIG. 5C is a front view of a printed circuit board of the device;

FIGS. 6A to 6C are views of the protection device of FIG. 3, showing an operation of the device when unconsciously selecting another function while disregarding the fact that the specified function has been selected and carried out, in which:

FIG. 6A is a front view of the device;

FIG. 6B is a bottom view of the device from which a bottom case is removed; and

FIG. 6C is a front view of a printed circuit board of the device.

DESCRIPTION OF THE PREFERRED EMBODIMENTS

In the following description for the digital multimeter protection device of the present invention, the construction of a digital multimeter comprising measuring elements and measuring circuits encased in a top case 1 and a bottom case 2 is known in the digital multimeter field and further explanation is thus not deemed necessary.

Figure 1A:
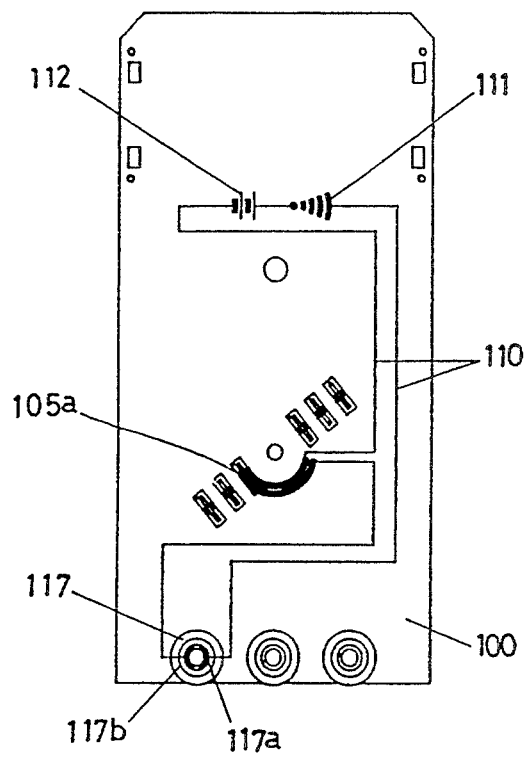
FIG. 1A is a front view of a printed circuit board having a signaling circuit of a conventional digital multimeter protection device signaling an input plug misinsertion of the multimeter.
Figure 1B:
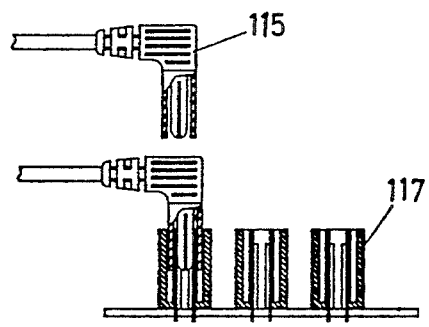
FIG. 1B is a sectional view showing an input plug and input cores of the digital multimeter protection device of FIG. 1A.
Figures 2A, 2B:
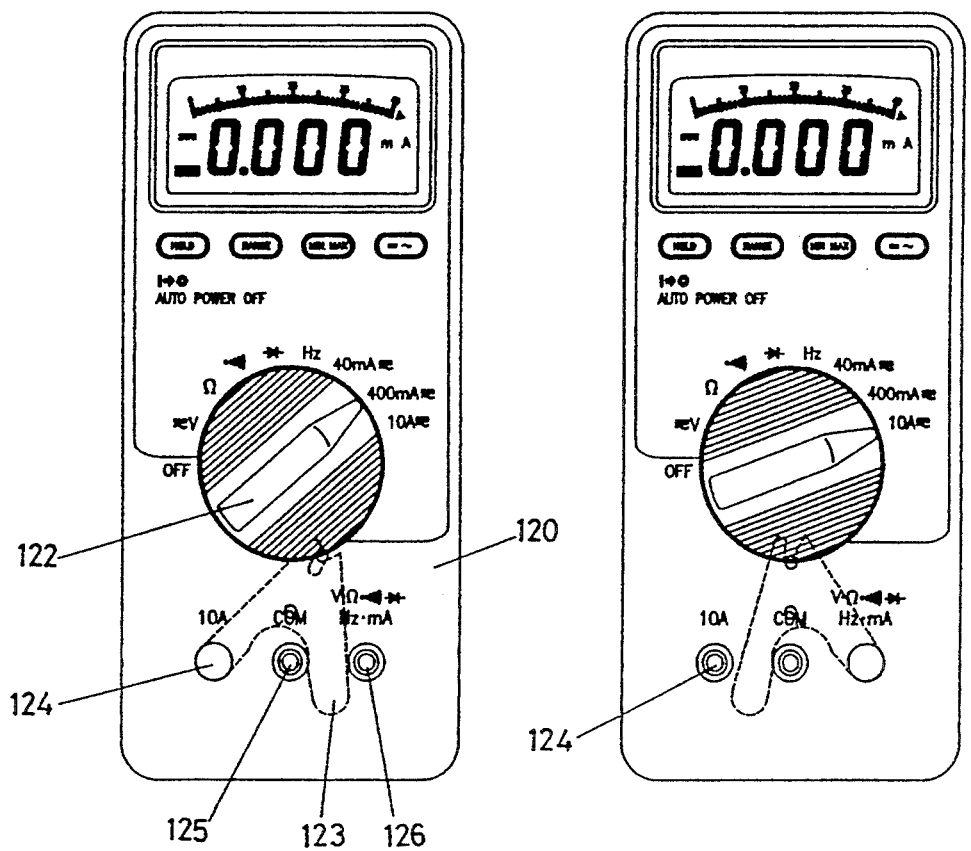
Figure 3:
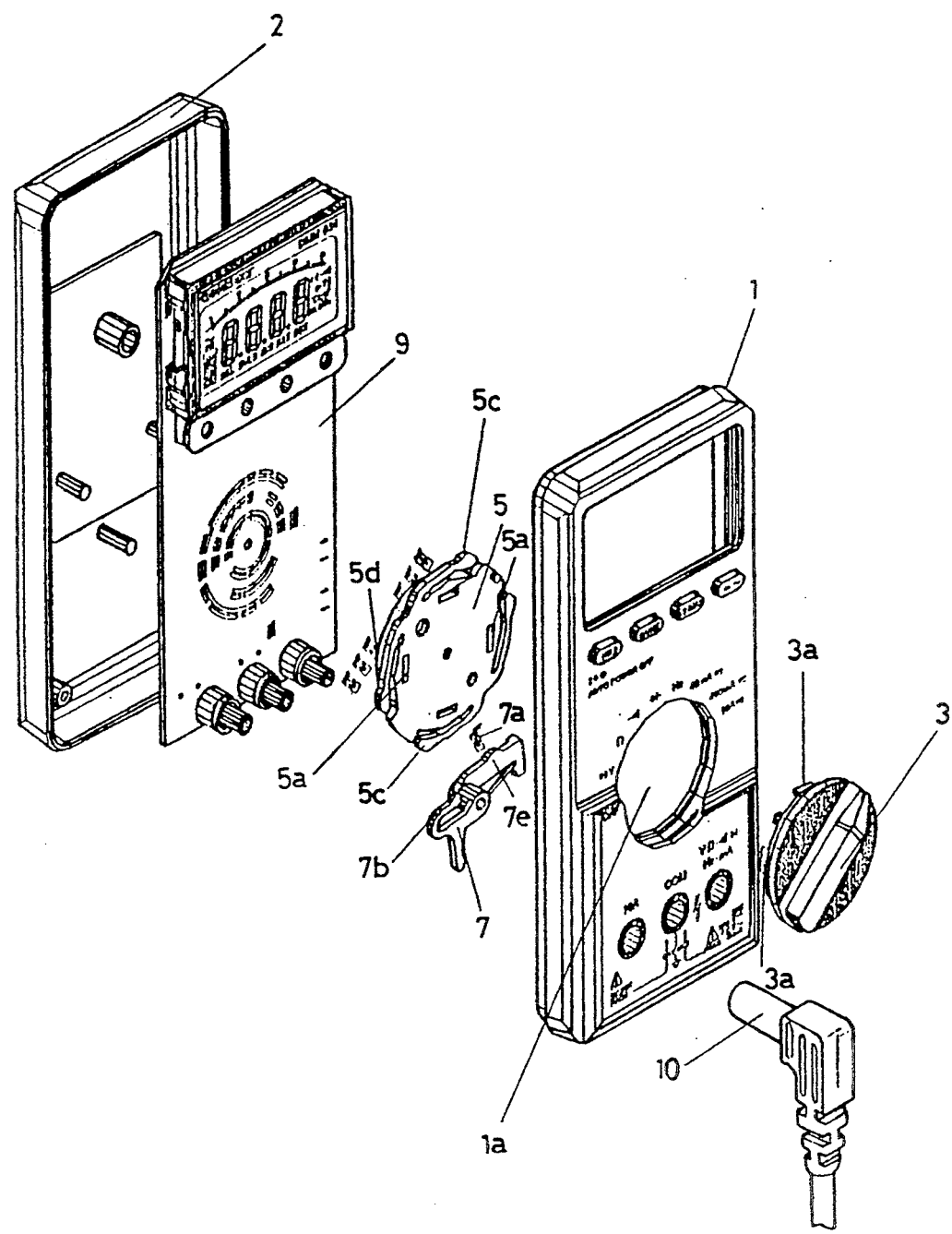
FIG. 3 is an exploded perspective view of a digital multimeter provided with a digital multimeter protection device in accordance with a preferred embodiment of the present invention.

With reference to FIG. 3, there is shown in an exploded perspective view of a digital multimeter provided with a digital multimeter protection device in accordance with a preferred embodiment of the present invention. The digital multimeter protection device (hereinbelow, referred to simply as "the protection device") comprises a rotary type function switch 3 which is rotatably placed on the top case 1 such that it is operated at the outside. A rotating plate 5 is coupled to a lower surface of the function switch 3 and cooperates with the switch 3. The protection device also includes a printed circuit board 9 provided with alarm means. This alarm means is turned on by a contact spring mounted on the rotating plate 5 and generates an alarm sound. A shielding lever 7 is added to the device and shields a plug insert or an input core as a result of rotation of the rotating plate 5.

In the conventional manner, the top case 1 is provided thereon with a digital display 1b for displaying the measuring result thereon. The function switch 3 and a plurality of plug inserts 14, 15 and 16 are placed on the top case 1 of the digital multimeter such that they are exposed to the outside of the top case 1.

As well known to those skilled in the art, a desired measuring function of the multimeter is selected by rotating the function switch 3. In order to select the desired measuring function, the function switch 3 is manually rotated. This function switch 3 is rotatably placed on the top case 1 in such a manner that it is received in a switch receiving opening 1a of the top case 1. The lower surface of a circular periphery defining the opening 1a is provided with a tooth part 1c as shown in FIG. 4B. The rotating plate 5 is coupled to the lower surface of the function switch 3 such that it is rotated along with the function switch 3. In the preferred embodiment of FIG. 3, four projections 3a of the function switch 3 are received in their respective slots 5a of the rotating plate 5, thus to rotate the rotating plate 5 when the switch 3 is rotated and to achieve the cooperation of the rotating plate 5 with the function switch 3.

Four spring arms 5c are integrally formed with the periphery of the rotating plate 5. The ends of the spring arms 5c of the plate 5 are provided with predetermined elasticity and engaged with the tooth part 1c of the top case 1, thus allowing the user to select a desired function. In addition, an appropriate number of contact springs 5d made of a conductive material are mounted on the lower surface of the rotating plate 5. The contact springs 5d act as switches for turning on a signaling circuit, which will be described in detail below. A protrusion 5e is provided on the periphery of the rotating plate 5.

On the lower surface of the top case 1, the shielding lever 7 is hinged so that it contacts the periphery of the rotating plate 5 such that it can rotate with respect to the rotating plate 5. The lever 7 is hinged at its center to the lower surface of the top case 1. In addition, this lever 7 is provided with a contact spring 7a at an end thereof and both a U-shaped elastic arm 7b and a projection 7c at the other end thereof. The contact spring 7a of the shielding lever 7 is the same type of spring as the contact springs 5d of the rotating plate 5. A protrusion 7e is provided on the shielding lever 7. A portion of the lever 7, on which portion the protrusion 7e is provided, is close to the contact spring 7a. At this portion, the shielding lever 7 comes into contact with the rotating plate 5.

The printed circuit board 9, on which an alarm generating circuit 9a is patterned, is provided under the lower surface of the rotating plate 5. The printed circuit board 9 is provided with alarm means 9c which is in turn electrically connected to a power source 9b. The alarm generating circuit 9a is open at two points at which the circuit 9a is selectively closed by the above contact springs 5d and 7a respectively, thus generating an alarm sound through the alarm means 9c. That is, the contact springs 5d of the rotating plate 5 and the contact spring 7a of the shielding lever 7 constitute respective ON-/OFF switching parts for the two open points of the alarm generating circuit 9a in accordance with a relative position between the rotating plate 5 and the shielding lever 7. When either of the ON/OFF switching parts comprising the contact springs 5d and 7a is switched off, the alarm generating circuit 9a is open and, as a result, no alarm sound is generated by the circuit 9a. Here, the contact springs 5d on the lower surface of the rotating plate 5 close the alarm generating circuit 9a whenever a function except the 10A function is selected by the function switch 3.

Hereinafter, the operational effect of the above protection device will be described in detail.

When any function except the 10A function is selected by the function switch 3, the elastic arm 7b provided on the other end of the shielding lever 7 is caught by a projection pin 1m provided on the lower surface of the top case 1 as shown in FIGS. 4A to 4C. Hence, the shielding lever 7 is biased clockwise. At this state, the projection 7c of the lever 7 shields the 10A plug insert 14 as shown in FIG. 4B, so that the input plug 10 can not be inserted into this 10A plug insert 14.

At this state, the alarm generating circuit 9a is opened, so that it generates no alarm sound. That is, since the switching part of the circuit 9a comprising the contact spring 7a of the lever 7 is switched off while the switching part comprising the contact springs 5d of the rotating plate 5 is switched on, the circuit 9a is opened and generates no alarm sound.

Figure 5A:
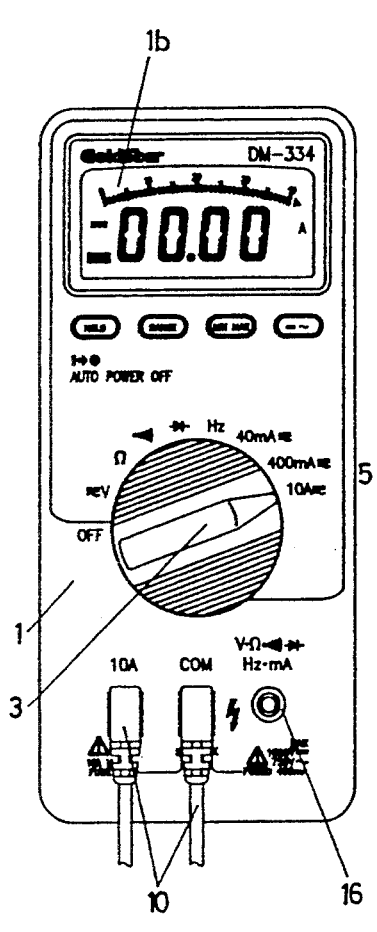
Figure 5B:
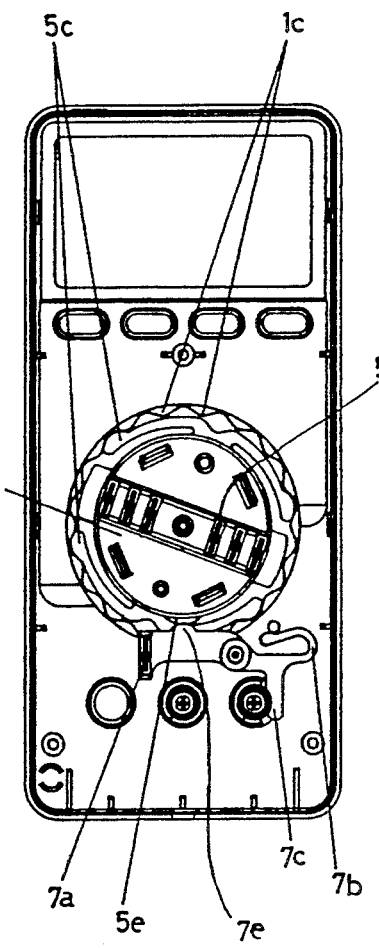
Figure 5C:
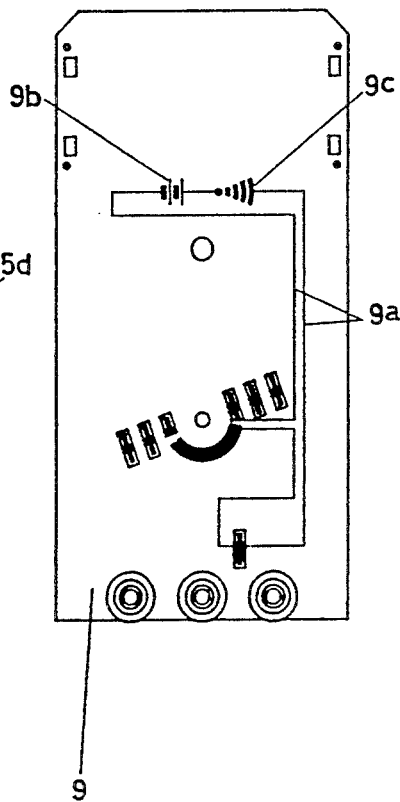
Figure 6A:
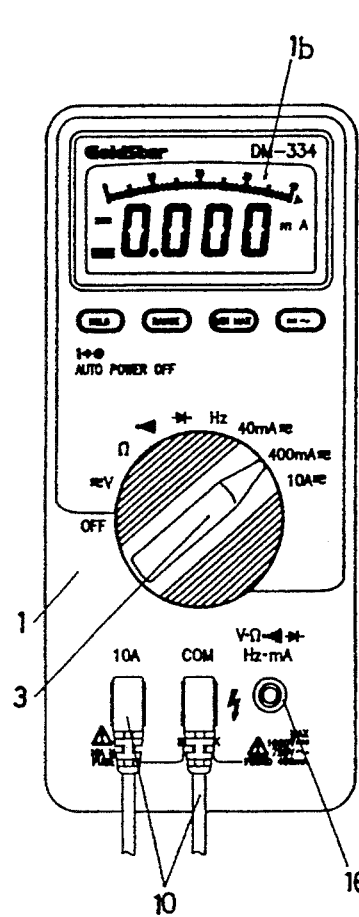
Figure 6B:
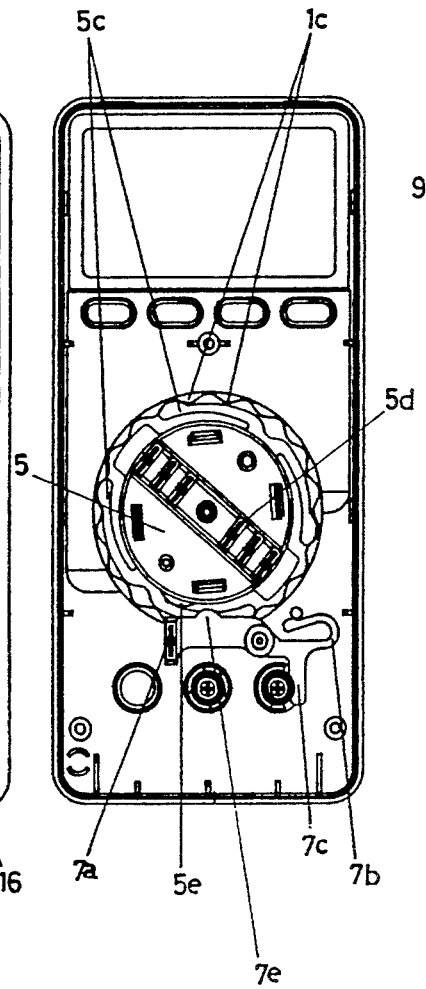
Figure 6C:
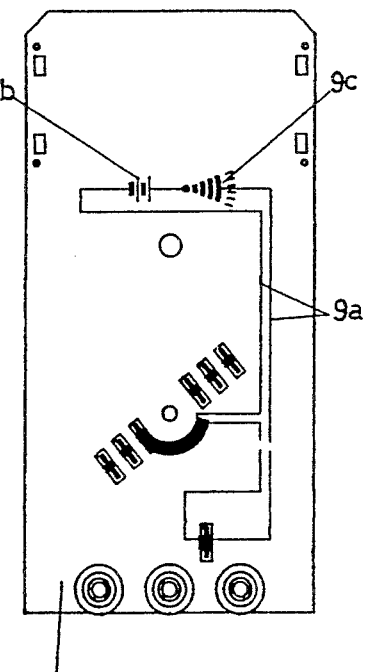

When the function switch 3 is rotated in order to select the 10A function, the state of the device shown in FIGS. 5A to 5C is achieved. In this state, the protrusion 5e of the rotating plate 5 pushes down the projection 7e of the lever 7 and, as a result, the lever 7 is biased counterclockwise. Hence, the shielding lever 7 having shielded the 10A plug insert 14 does not shield the plug insert 14 any more, so that it is possible to insert the input plug 10 into the 10A plug insert 14. At this state, the plug 10 is inserted into the 10A plug insert 14 and the digital multimeter carries out the selected 10A function, that is, the current measuring function.

In this case, the switching part of the circuit 9a comprising the contact spring 7a of the shielding lever 7 is switched on while the switching part comprising the contact springs 5d of the rotating plate 5 is switched off, thus opening the circuit 9a and generating no alarm sound.

When the function switch 3 is unconsciously rotated in order to select a function except the 10A function under the condition that the input plug 10 is continuously inserted in the 10A plug insert 14, the contact spring 7a of the lever 7 can not be moved due to the inserted plug 10 and, as a result, the switching part comprising the contact spring 7a continues its switching on state. However, the rotation of the function switch 3 causes rotation of the rotating plate 5, thus to move the contact springs 5d of the rotating plate 5. The switching part comprising the contact springs 5d of the plate 5 is thus switched on. Otherwise stated, all the two switching parts of the alarm generating circuit 9a comprising the contact springs 5d and 7a are switched on and close the alarm generating circuit 9a, thereby generating the alarm sound through the alarm means 9c.

When hearing the alarm sound, the user can remove the input plug 10 from the 10A plug insert 14, thus preventing the digital multimeter from being electrically shocked and damaged by the misinsertion of the input plug 10.

In the above description, the 10A current measuring function is an example of the specified function of the digital multimeter provided with the protection device of this invention. However, it is apparent that the present invention can be adapted to another function besides the 10A function. That is, the present invention can be used for prevention of damage to the digital multimeter caused by a misinsertion of an input plug when a function except the 10A function is set as the specified function.

As described above, the multimeter protection device according to the present invention reliably prevents misinsertion of an input plug into a plug insert corresponding to a specified function, for example, a 10A current measuring function, when the specified function is not selected by the function switch. Hence, this protection device prevents electric shock and damage to the multimeter caused by the misinsertion of the input plug and protects the digital multimeter.

In addition, the protection device of this invention instantaneously signals when the user unconsciously operates the function switch in order to change the function of the multimeter while disregarding the fact that the input plug is continuously inserted in a plug insert of the multimeter. Therefore, this protection device prevents unconscious operation of the function switch when the input plug is continued in its insertion into the plug insert, so that this device reliably prevents damage to the digital multimeter.

Although the preferred embodiments of the present invention have been disclosed for illustrative purposes, those skilled in the art will appreciate that various modifications, additions and substitutions are possible, without departing from the scope of the invention as disclosed in the accompanying claims.

What is claimed is:

1. A device for protecting a digital multimeter from misinsertion of an input plug, said multimeter having a measuring result display on its top case, a plurality of plug inserts and a rotary type function switch for selecting a desired function, the device comprising:

plug misinsertion preventing means for preventing said input plug from being inserted into a specified one of said plug inserts when a function other than a specified function is selected, said specified function corresponding to said specified plug insert; and alarm generating means for generating an alarm signal when said function switch is operated in order to change a function when said input plug is inserted in said specified plug insert, wherein said plug misinsertion preventing means cooperates with said alarm generating means such that when said function switch selects said specified function said plug misinsertion preventing means acts to at least partially enable said alarm generating means.

2. The device according to claim 1, wherein said plug misinsertion preventing means cooperates with said function switch and selectively shields said specified plug insert.

3. The device according to claim 1, wherein said plug misinsertion preventing means comprises:
   a rotating plate coupled to a lower surface of said function switch and arranged to rotate together with said function switch, said rotating plate having a protrusion on its periphery; and
   a shielding lever rotatably mounted on a lower surface of said top case of the multimeter, said shielding lever being located under said rotating plate such that said shielding lever cooperates with said rotating plate, said shielding lever being turned at a predetermined angle by said protrusion of the rotating plate when the rotating plate is rotated, thus shielding said specified plug insert.

4. The device according to claim 3, wherein said alarm generating means comprises:
   a first contact spring mounted on a lower surface of said rotating plate;
   a second contact spring mounted on an end of said shielding lever; and
   an alarm generating circuit having both switching parts and alarm means, said switching parts including said first and second contact springs wherein when said alarm generating circuit is switched on by said contact springs said alarm generating circuit generates an alarm.

5. A digital multimeter comprising:
   a case;
   a circuit board located inside said case, said circuit board being capable of performing a plurality of functions;
   a rotary type function switch for selecting a desired function from said plurality of functions;
   a plurality of plug inserts electrically connected to said circuit board, each plug insert being associated with at least one of said plurality of functions;
   plug misinsertion preventing means for preventing an input plug from being inserted into a specified one of said plug inserts when a function that is not associated with said specified plug insert is selected, said plug misinsertion preventing means being moved between a shielding position and a non-shielding position by movement of said rotary function switch; and
   alarm generating means for generating an alarm when said function switch is rotated to a function that is not associated with a plug insert that has an input plug therein.

6. The multimeter according to claim 5 wherein said plug misinsertion preventing means comprises a shielding lever in cooperation with said function switch, whereby the movement of said function switch causes said shielding lever to shield said specified plug insert thus preventing the insertion of said input plug.

7. The multimeter according to claim 6 wherein said plug misinsertion preventing means further comprises a rotating plate coupled to a lower surface of said function switch, said rotating plate rotating in conjunction with said function switch, said rotating plate having a protrusion on its periphery, said shielding lever being rotatably mounted on said multimeter and located under said rotating plate such that said shielding lever cooperates with said rotating plate and said shielding lever is rotated by said protrusion of said rotating plate when said rotating plate is rotated, thus shielding said specified plug insert.

8. The multimeter according to claim 5 wherein said alarm generating means comprises:
   an alarm means; and
   an alarm generating circuit including first and second switching parts, whereby when said first and second switching parts are switched on said alarm generating circuit operates to activate said alarm means.

9. The multimeter according to claim 8 wherein said first switching part includes a first contact spring mounted on a lower surface of said rotating plate and said second switching part includes a second contact spring mounted on an end of said shielding lever.

10. The multimeter according to claim 5 wherein said rotary type function switch is mounted on said circuit board.

11. A digital multimeter comprising:
   a case;
   a circuit board located inside said case, said circuit board being capable of performing a plurality of functions;
   a rotary type function switch for selecting a desired function from said plurality of functions;
   a plurality of plug inserts electrically connected to said circuit board, each plug insert being associated with at least one of said plurality of functions;
   plug misinsertion preventing means for preventing an input plug from being inserted into a specified one of said plug inserts when a function that is not associated with said specified plug insert is selected; and
   alarm generating means for generating an alarm when said function switch is rotated to a function that is not associated with said specified plug insert that has an input plug therein, said alarm generating means including an alarm means, and an alarm generating circuit having first and second switching parts, said second switching part being located on said plug misinsertion preventing means wherein when said function switch selects a function associated with said specified plug insert said plug misinsertion preventing means acts to turn on said second switching part.

12. The multimeter according to claim 11 wherein:
   said plug misinsertion preventing means further includes a rotating plate coupled to a lower surface of said function switch, said rotating plate rotating in conjunction with said function switch, said rotating plate having a protrusion on its periphery, shielding lever being rotatably mounted on said multimeter and located under said rotating plate such that said shielding lever cooperates with said rotating plate and said shielding lever is rotated by said protrusion of said rotating plate when said rotating plate is rotated, thus shielding said specified plug insert; and said first switching part includes a first contact spring mounted on a lower surface of said rotating plate and said second switching part includes a second contact spring mounted on an end of said shielding lever.

13. The multimeter according to claim 11 wherein said rotary type function switch is mounted on said circuit board.

* * * * *

UNITED STATES PATENT AND TRADEMARK OFFICE
CERTIFICATE OF CORRECTION

PATENT NO. : 5,442,337
DATED : August 15, 1995
INVENTOR(S) : Dong W. Hwang

It is certified that error appears in the above-indentified patent and that said Letters Patent is hereby corrected as shown below:

On the title page, item [73] Assignee, should read

-- Goldstar Precision Co., Ltd.  Seoul, KOREA --

Signed and Sealed this

Twenty-eighth Day of May, 1996

*Attest:*

BRUCE LEHMAN

*Attesting Officer*        *Commissioner of Patents and Trademarks*